US006677759B2

(12) United States Patent
Friel et al.

(10) Patent No.: US 6,677,759 B2
(45) Date of Patent: Jan. 13, 2004

(54) METHOD AND APPARATUS FOR HIGH-VOLTAGE BATTERY ARRAY MONITORING SENSORS NETWORK

(75) Inventors: Daniel D. Friel, Woburn, MA (US); Louis Hruska, Weston, MA (US)

(73) Assignee: Microchip Technology Incorporated, Chandler, AR (US)

(*) Notice: Subject to any disclaimer, the term of this patent is extended or adjusted under 35 U.S.C. 154(b) by 0 days.

(21) Appl. No.: 10/131,064

(22) Filed: Apr. 24, 2002

(65) Prior Publication Data

US 2002/0163339 A1 Nov. 7, 2002

Related U.S. Application Data

(60) Provisional application No. 60/288,158, filed on May 2, 2001.

(51) Int. Cl.[7] .............................................. G01N 27/416
(52) U.S. Cl. ...................................................... 324/430
(58) Field of Search ................................ 320/119, 122, 320/134, 136, 155; 324/430, 426

(56) References Cited

U.S. PATENT DOCUMENTS 4,707,795 A 11/1987 Alber et al.
5,281,920 A 1/1994 Wurst
5,666,040 A * 9/1997 Bourbeau ................... 320/118
5,705,929 A 1/1998 Caravello
5,744,962 A 4/1998 Alber et al.
5,757,192 A 5/1998 McShane et al.
5,821,757 A 10/1998 Alvarez et al.
5,969,625 A 10/1999 Russo
6,133,709 A 10/2000 Puchianu
6,150,795 A 11/2000 Kutkut et al.
6,163,156 A 12/2000 Bertness
6,172,505 B1 1/2001 Bertness
6,184,656 B1 2/2001 Karunasiri et al. ......... 320/119

OTHER PUBLICATIONS

International Search Report PCT/US02/12784, Mailed Sep. 12, 2002.

* cited by examiner

*Primary Examiner*—Gregory J. Toatley, Jr.
(74) *Attorney, Agent, or Firm*—Baker Botts L.L.P.

(57) ABSTRACT

A battery-monitoring system in accordance with the principles of the present invention includes one or more cell sensors modules linked to a battery sensor module via a data interface. In turn, the one or more battery sensor modules may be linked to an alarm interface. Each cell sensor module includes one or more sensors that monitor physical parameters, such as cell voltage and temperature, related to the corresponding cell. Each battery sensor module monitors physical parameters, such as battery voltage, discharge current, and temperature related to the battery. The battery sensor module also gather cell monitoring information from the plurality of cell sensor modules. Various battery monitor-related analytical, control, and reporting functions may be performed by the various modules.

36 Claims, 4 Drawing Sheets

408
400
404
406
402
410
401

METHOD AND APPARATUS FOR HIGH-VOLTAGE BATTERY ARRAY MONITORING SENSORS NETWORK

RELATED APPLICATION

This application claims the benefit of the U.S. Provisional Application Serial No. 60/288,158, filed May 2, 2001, Docket No. 56363-137 (PSIK-016PR), entitled BATTERY ARRAY MONITORING SENSORS AND NETWORK, invented by Daniel D. Friel and Louis Hruska, which application is hereby incorporated by reference in its entirety.

FIELD OF THE INVENTION

The invention relates to battery power-control and, more particularly, to battery monitoring.

BACKGROUND OF THE INVENTION

Flashlights, handheld computers, and cellular telephones are not the only devices that are "battery-operated." Large-scale battery installations are used, for example, as backup power sources in the telecommunications industry and in uninterruptable power supplies. Because these applications are inherently reliability-sensitive (these are backup applications, after all), it is essential to monitor the state of such batteries. In order to thoroughly monitor the status of several cells within a battery, and several batteries within an installation, conventional battery monitoring systems may distribute sensors throughout the battery stacks and run several wires from each cell to a central battery monitor. The complex array of wires that results is not only inconvenient and expensive to install and maintain, it also poses a hazard to personnel and equipment. Some monitoring systems reduce the expense and hazard associated with such an installation by reducing the number of cells monitored, proportionally reducing the number of connecting wires strung to the central monitor. Although some cost savings and reduction in hazard may be achieved by this approach, there is a concomitant reduction in battery monitoring information. This dearth of battery information may lead to costly, otherwise avoidable, battery faults and can result in power outages and loss of service.

A system and method for monitoring a battery permits relatively easy interconnection of monitoring units and, at the same time, provides thorough monitoring of the battery components would therefore be highly desirable.

SUMMARY

A battery-monitoring system in accordance with the principles of the present invention includes one or more cell sensor modules linked to a battery sensor module via a "power-isolated" network. In turn, one or more battery sensor modules may be linked to an alarm interface. A battery-monitoring system in accordance with the principles of the present invention may form a hierarchical system that includes one cell-sensor module per battery cell, with all the cell sensor modules linked to a battery sensor module and, in a multi-battery configuration, all the battery sensor modules linked to an alarm interface that provides access to the external world, in the form of a workstation that operates as a site monitor, for example.

Each cell sensor module may be configured to fit between the terminals of a cell and to attach to cell terminals via spring-clips and tabs. Each cell sensor module may include one or more sensors that sense a cell-related physical parameter, a signal conditioner, a controller, and a communications interface. The one or more sensors may be voltage or temperature sensors, for example, and the signal conditioner may include circuitry configured to amplify, offset, scale-adjust or otherwise enhance the raw signal provided by the one or more sensors. Additionally, the signal conditioner may include one or more analog-to-digital-converters (ADCs) configured to convert the conditioned sensor signals from the one or more sensors from analog to digital form. A single ADC with multiplexed input may be used to convert multiple sensor inputs, for example. The cell sensor module's controller, which may take the form of an embedded microprocessor core within an application specific integrated circuit, for example, may initiate the conversion of sensor signals from analog to digital form and store the results of such conversions. The controller may also perform analytical operations, such as averaging values obtained by the sensors, determining peak sensor values, and logging events such as the excursion of a sensor signal beyond one or more thresholds. The controller may also exercise control over the communications interface, receiving messages from the interface and formatting responses through the interface. In order to ensure survivability of the communications link while, at the same time, employing a relatively simple, economical, serial topology, the communications link is "power-isolated." That is, the local and link sides of the interface employ separate power sources. The local side of each communications interface receives power from the cell to which the sensor module is attached and the link side of the communications interface receives power from a central source, such as the battery sensor module, for example. In this way, the failure of an individual battery cell will not "bring down" the entire communications network.

A battery sensor module may be configured to fit between a battery terminal and a load; attached, for example, to a bus bar that provides the conductive path from the battery to the electrical load. Each battery sensor module may include one or more sensors that sense a battery-related physical parameter, a signal conditioner, a controller, and a communications interface. The one or more sensors may be voltage, temperature, or current sensors, for example, and they are connected to measure corresponding battery-level values. That is, unlike a cell sensor module, which is configured to monitor the voltage, temperature or other parameter of an individual cell within a battery, a battery sensor module is configured to measure, for example, the voltage and discharge current, of the entire assemblage of cells that constitute a battery. The battery sensor module's signal conditioner may include circuitry configured to amplify, offset, scale-adjust or otherwise enhance the raw signal provided by the one or more sensors. Additionally, the signal conditioner may include one or more ADCs configured to convert the conditioned sensor signals from analog to digital form. A single ADC with multiplexed input may be used to convert multiple sensor inputs. The battery sensor module's controller, which may take the form of an embedded microprocessor core within an application specific integrated circuit, may initiate the conversion of sensor signals from analog to digital form and store the results of such conversions. The controller may also perform analytical operations, such as averaging values obtained by the sensors, determining peak sensor values, and logging events such as signal excursions beyond thresholds. The controller may also exercise control over the communications interface: receiving messages from the interface and formatting responses to the interface. The battery sensor module's controller may query the various cell sensor modules within the battery, analyze sensor output and/or reduced data from the various cell sensor modules, and provide information to the alarm interface related to the status of the cells under its purview.

The alarm interface includes a communications interface for communicating with one or more battery sensor modules. The alarm interface provides a link between each cell and each battery in an installation and the external world. The external world may take the form, for example of a workstation that operates as a site monitor, for example. The alarm interface may include a user interface that permits input from and output to a user, directly, through visual and/or audio signals, or remotely, through a communications link.

In an illustrative embodiment, the isolated data interface includes opto-isolators at each cell sensor module and at the batter sensor module. The opto-isolators provide separation between the electrical power system of each cell sensor module and the electrical power system of the link, which obtains power from the battery sensor module. Additionally, in this illustrative embodiment, the topology of the battery cell communications link is a daisy-chained serial link, with its physical layer in compliance with the RS485 communications standard.

The new battery-monitoring system may be particularly useful in high-capacity battery installations, such as those employed in telecommunications systems and uninterruptable power supplies, for example. The new system is also useful in high-voltage mobile battery applications, such as hybrid electric vehicles (HEVs) which require precise monitoring and management but employ large high-voltage battery arrays.

BRIEF DESCRIPTION OF THE DRAWINGS

The above and further features, aspects, and advantages of the invention will be apparent to those skilled in the art from the following detailed description, taken together with the accompanying drawings in which.

DETAILED DESCRIPTION

Figure 1:
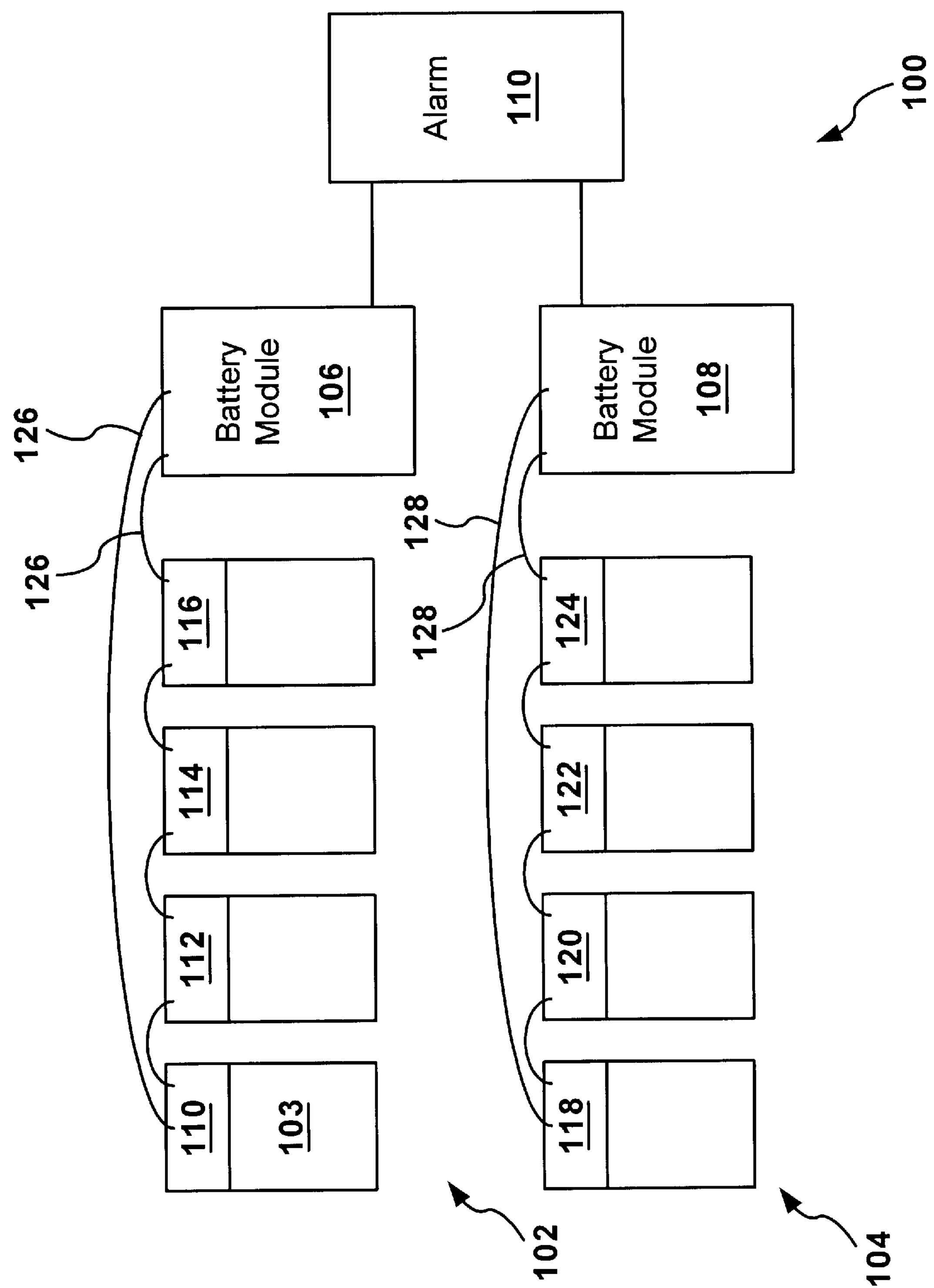
FIG. 1 is a block diagram of a battery-monitoring system in accordance with the principles of the present invention.

The conceptual block diagram of FIG. 1 illustrates a battery-monitoring system 100 in accordance with the principles of the present invention. This illustrative battery monitoring system 100 monitors two batteries 102, 104 with respective battery sensor modules 106, 108 interfaced to an external interface 110 (also referred to herein as an alarm interface). Each battery sensor module 106, 108 is linked with respective cell sensor modules 110, 112, 114, 116 and 118, 120, 122, 124 through respective isolated-power, daisy-chained, serial data networks 126, 128. In this illustrative embodiment, the topology of the battery cell communications network is that of a daisy-chained serial link, with its physical layer in compliance with the RS485 communications standard. The cell sensor modules monitor, store, and report data related to physical parameters, such as voltage or temperature, associated with the respective cell. The battery sensor modules monitor physical measurements related to an array of cells that constitutes a battery. In addition to measuring battery-level voltage and current drain, for example, the battery sensor module gathers information from each of the cell sensor modules to accumulate information related to the overall state of the battery and to the state of individual cells within the battery. The cell sensor and/or battery sensor modules may perform various data reduction operations, such as averaging or peak detection, for example. The alarm interface 110 links the battery monitoring system to the outside world through a site monitor, system controller or other, centralized controller. The alarm interface 110 may interpret data and analyses from a plurality of battery sensor modules and pass this information along to a site monitor or other outside world devices. The alarm interface 110 may include a user interface that permits input from and output to a user, directly, through visual and/or audio signals, or remotely, through a communications link. The battery-monitoring system 100 may be contained within a high-voltage mobile battery system within a hybrid electric vehicles (not shown), or a telecommunications office (not shown), for example.

Figure 2:
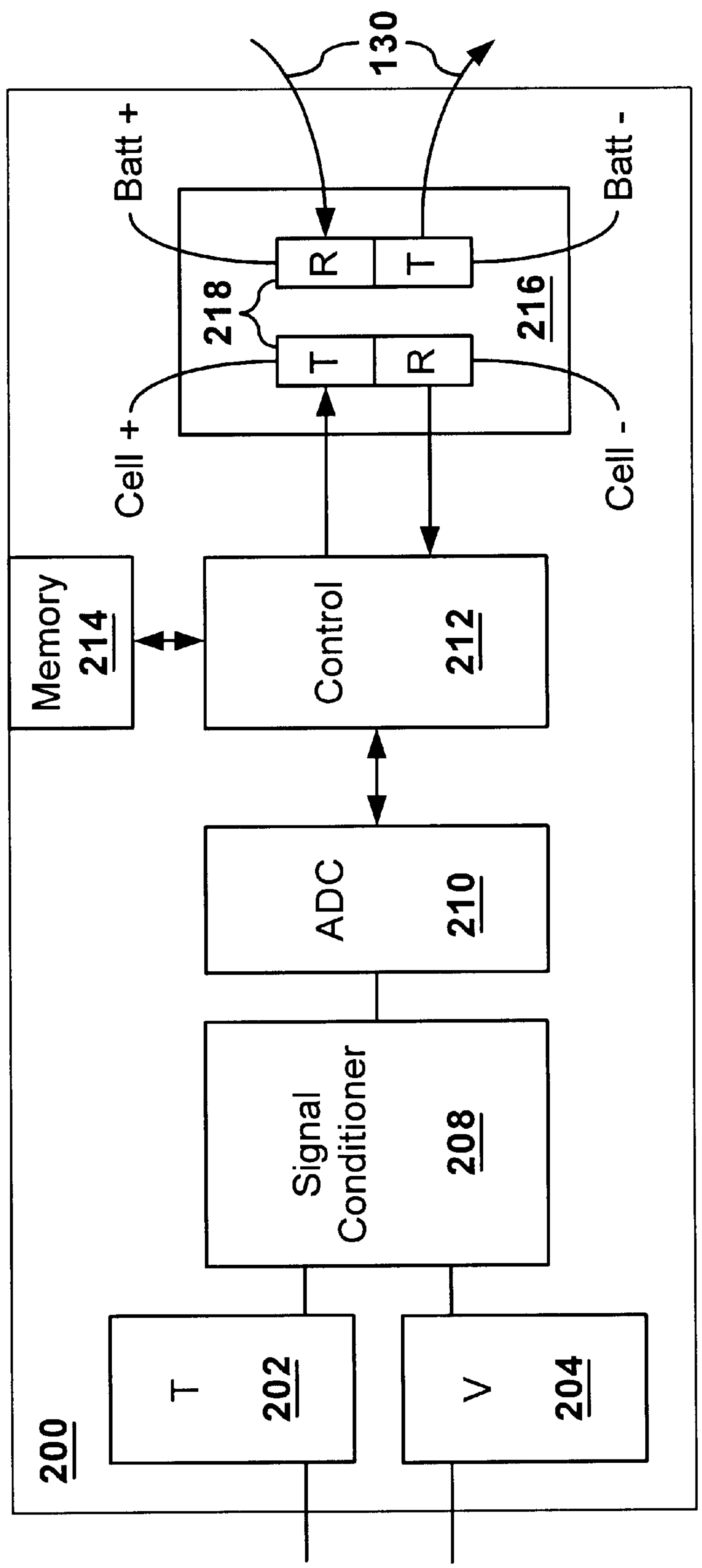
FIG. 2 is a block diagram of a cell sensor module in accordance with the principles of the present invention.

The block diagram of FIG. 2 illustrates the components of a cell sensor module 200 in accordance with the principles of the present invention. In this illustrative embodiment, the cell sensor module 200 includes a temperature sensor 202 and a voltage sensor 204 respectively configured to measure the temperature and voltage of the cell to which they are attached. A signal conditioner 208 includes circuitry that operates on the raw signals provided by the sensors 202, 204 to amplify, offset, scale-adjust or otherwise enhance the raw signals provided by the sensors 202, 204 as necessary for proper conversion from analog to digital form by the ADC 210. The ADC 210 includes a multiplexed input that permits the sequential conversion of the temperature and voltage signals. A controller 212, which may be an embedded core microprocessor, for example, controls the operation of the ADC 210 by selecting which sensor's signal is to be converted. Additionally, the controller 212 may store the results of such conversions, for example in nonvolatile memory 214, such as electrically erasable programmable read only memory (EEPROM). The controller 212 may also perform analytical, data reduction, operations, such as averaging values obtained by the sensors, determining peak sensor values, and logging events such as the excursion of a sensor signal beyond a threshold. The controller 212 may also exercise control over a communications interface 216: receiving messages from the communications interface 216 and formatting responses to the interface.

The communications interface 216 obtains power from two separate sources. On the "cell" or "local" side, the interface 216 obtains power from the cell to which the cell sensor module 200 is attached. On the "link" or "remote" side, the interface 216 obtains power from the battery of which the cell is a part. The battery-power is distributed through a link, along with data lines that form a part of the daisy-chained serial network (e.g., network 130). In this illustrative embodiment, the interface 216 includes an opto-isolator 218 that operates as a serial communications transceiver. The opto-isolator 218 includes transmitter/receiver pairs that are powered by cell power on the local side of the interface and by battery power in the remote side of the link. In each communications direction, a photo-transmitter (e.g., a light emitting diode) transforms digital electronic signals into pulses of light and transmits the pulses to a photo-receiver (e.g., a photodiode). Because the photo-transmitter and photo-receiver receive power from separate sources, the failure of an individual cell will not "bring down" the entire communications network 130. Additionally, the network interface 216 does not rely upon the cell side of the interface to regenerate network traffic. That is, a pass-through in the network interface 216, powered by the remote side (Batt+, Batt−), ensures the continuity of the network, even in the event of a failure on the local side, such as the failure of the cell that supplies local power (Cell+, Cell−).

The cell sensor module 200 may include modes of operation, such as a low power consumption, or "hibernation", mode in which operations are curtailed to save operating power. For example, the sensor measurements and/or analog to digital conversion of sensor signals may be performed less frequently in such a mode. Voltage and temperature measurements may be compared with thresholds values, such as minimum or maximum values, with any excursions beyond the threshold levels stored in the non-volatile memory 214. The controller 212 may perform calculations on the sensor values, such as averages, deviation limits, or time beyond a threshold, for example. The measurements may be taken in response to a command from an associated battery sensor module. Additionally, the measurements may be taken at the behest of the controller 212 as determined, for example, during an initial configuration. A cell sensor module may be integral to a battery cell, in that it may be directly attached to a cell and remain attached to the cell for the cell's duration.

Figure 3:
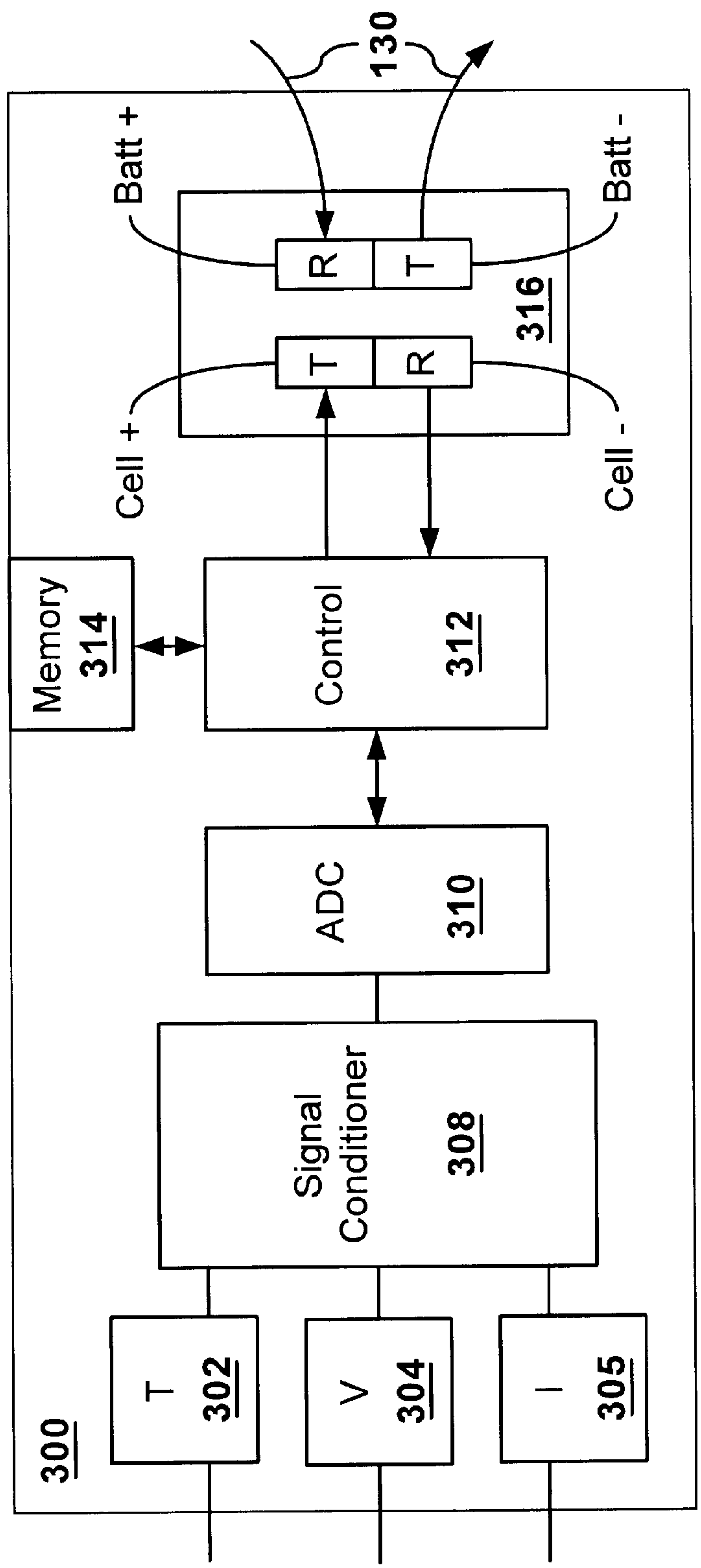
FIG. 3 is a block diagram of a battery sensor module in accordance with the principles of the present invention.

The block diagram of FIG. 3 illustrates a battery sensor module 300 in accordance with the principles of the present invention. Such a battery sensor module 300 may be configured to fit between a battery terminal and a load, attached, for example, to a bus bar that provides the conductive path from the battery to the electrical load. Such a sensor module is described, for example, in U.S. Pat. No. 6,304,062 B1, issued Oct. 16, 2001, to Batson, which is hereby incorporated by reference. In this illustrative embodiment, the battery sensor module 300 includes a temperature sensor 302, a voltage sensor 304, and a current sensor 305 respectively configured to measure the temperature, voltage, and current of the battery to which they are attached. A signal conditioner 308 includes circuitry that operates on the raw signals provided by the sensors 302, 304, 305 to amplify, offset, scale-adjust or otherwise enhance the raw signal provided by the sensors 302, 304, 305 as necessary for proper conversion from analog to digital form by the ADC 310. The ADC 310 includes a multiplexed input that permits the sequential conversion of the temperature, voltage, and current signals.

A controller 312, which may be an embedded core microprocessor, for example, controls the operation of the ADC 310 by selecting which sensor's signal is to be converted. Additionally, the controller 312 may store the results of such conversions, for example in nonvolatile memory 314, such as electrically erasable programmable read only memory (EEPROM). The controller 312 may also perform analytical operations, such as averaging values obtained by the sensors, determining peak sensor values, and logging events such as the excursion of a sensor signal beyond a threshold. The controller 312 may also exercise control over a communications interface 316, receiving messages from the communications interface 316 and formatting responses to the interface. Because the battery sensor module 300 is monitoring the entire battery, rather than a single cell within the battery, the communications interface 316, need not employ a two-power system. The battery sensor module's controller 312 may query the various cell sensor modules within the battery (through the network 130), analyze sensor output obtained from the various cell sensor modules, and provide information to the alarm interface related to the status of the battery and cells it is monitoring.

The battery sensor module 300 provides power Batt+, Batt− to the serial network that links the battery- and cell-sensor modules. In an illustrative embodiment, a battery sensor module may be mounted on the negative terminal plate of a battery stack, with a power input and voltage sense lead attached to the battery stack's positive terminal plate. The battery sensor module may command associated cell sensor modules to measure their respective cell temperature and voltages at predetermined times, then read the results and compile a relatively complete picture of the battery status. The battery sensor module may then analyze the assembled data (including data obtained from the battery sensor module's sensors), to calculate and predict the performance of the battery.

Figure 4:
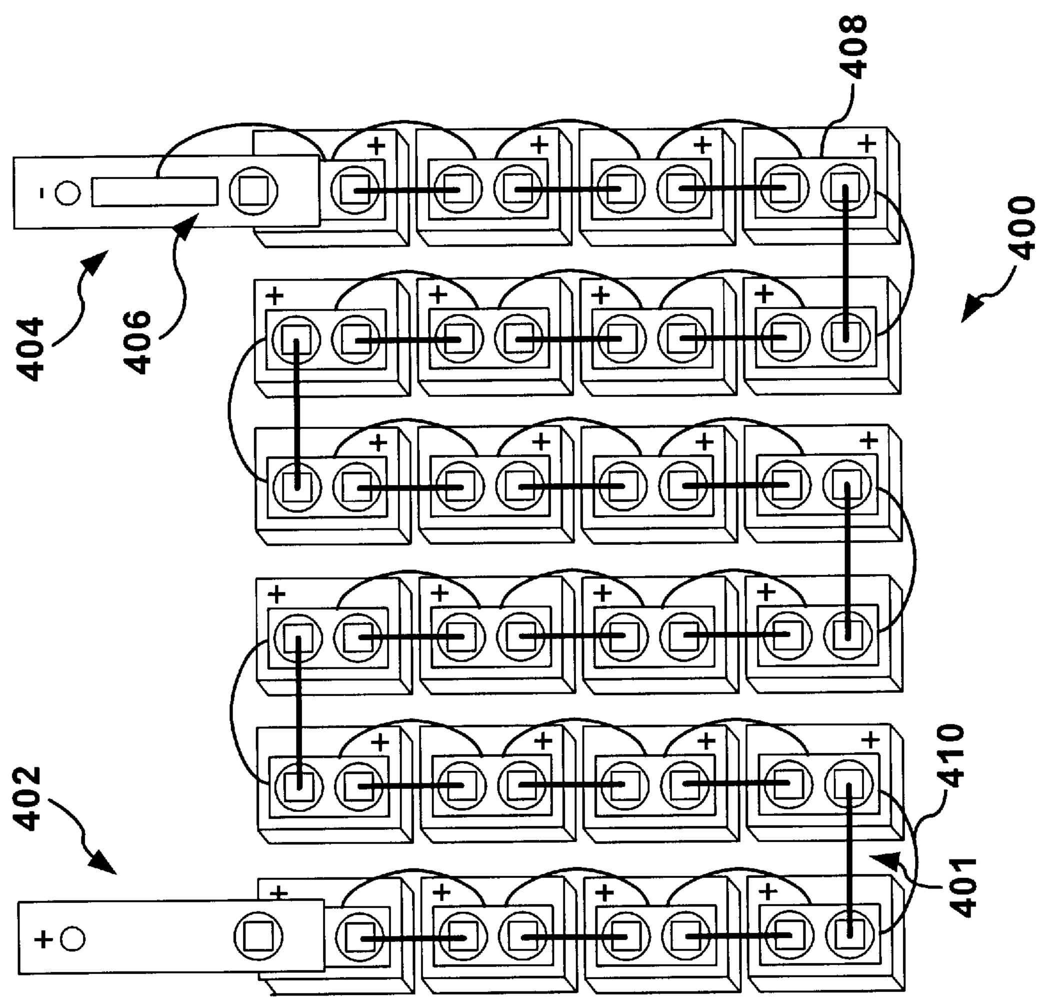
FIG. 4 is a conceptual layout of a battery power system that includes a battery-monitor in accordance with the principles of the present invention.

The new battery-monitoring system may be particularly useful in high-capacity battery installations, such as those employed in telecommunications systems and uninterruptable power supplies, for example. The conceptual physical layout of FIG. 4 may be employed in such an installation. An illustrative battery stack 400 includes twenty-four two-volt cells connected in series through bus-bars, such as bus bar 401, to yield a forty-eight volt potential across the positive 402 and negative 404 terminal plates. A battery sensor module 406, as previously described, is mounted on the negative terminal plate 404. A power input and voltage sense lead (not shown) is attached from the battery sensor module 406 to the battery stack's positive terminal plate 402. A cell sensor module, such as module 408, is attached to each of the cells. A serial, power-isolated, network link 410 connects the cells.

Although various exemplary embodiments of the invention have been disclosed, it will be apparent to those skilled in the art that various changes and modifications can be made which will achieve some of the advantages of the invention without departing from the spirit and scope of the invention. It will be evident to those reasonably skilled in the art that other components performing the same functions may be suitably substituted. Further, the methods of the invention may be achieved using software implementations, using the appropriate object or processor instructions, or in hybrid implementations that utilize a combination of hardware logic, software logic and/or firmware to achieve the same results. The specific configuration of logic and/or instructions utilized to achieve a particular function, as well as other modifications to the inventive concept are intended to be covered by the appended claims.

The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. A battery monitor system comprising:

a plurality of cell sensor modules configured to monitor one or more physical parameters related to an associated battery cell, each of said plurality of cell sensor modules records the number of times when one or more sensed cell values exceed one or more threshold values, wherein the one or more sensed cell values are associated with the one or more physical parameters related to the associated battery cell;

a battery sensor module configured to monitor one or more physical parameters related to an associated battery; and a network connecting said cell sensor modules and battery sensor module, said network configured to transmit information to and from said cell and battery sensor modules.

2. The battery monitor system of claim 1 further wherein the network is an isolated power network.

3. The system of claim 2 wherein the isolated power network includes a network interface at each cell sensor module, the interface respectively including local and remote power connections for the cell sensor and network sides of the interface.

4. The system of claim 3 wherein the network is a daisy-chained serial link.

5. The system of claim 4 wherein each interface includes an opto-isolator configured to transmit data across the interface opto-electronically.

6. The battery monitor system of claim 2 wherein the sensor module is configured to monitor a high-voltage vehicle-based battery array.

7. The battery monitor system of claim 1 wherein at least one cell sensor module is configured to sense the voltage of a battery cell to which it is attached.

8. The battery monitor system of claim 1 wherein at least one cell sensor module is configured to sense the temperature of a battery cell to which it is attached.

9. The battery monitor system of claim 1 wherein a battery sensor module is configured to sense the voltage of a battery with which it is in electrical communication.

10. The battery monitor system of claim 1 wherein a battery sensor module is configured to sense the current of a battery with which it is in electrical communication.

11. The battery monitor system of claim 1 wherein at least one battery sensor module is configured to sense the temperature of a battery with which it is in electrical communication.

12. The battery monitor system of claim 1 wherein each cell sensor module includes a controller that is configured to log data related to the one or more sensed cell values.

13. The battery monitor system of claim 1 wherein the battery sensor module includes a controller that is configured to record the number of times when one or more sensed battery values exceed one or more threshold values, wherein the one or more sensed battery values are associated with the one or more physical parameters related to the associated battery.

14. The battery monitor system of claim 13 wherein the battery sensor module controller is configured to log data related to the one or more sensed battery values.

15. The system of claim 14 wherein the cell sensor module controller and the battery sensor module controller are configured to communicate sensed values from the cell sensor module to the battery sensor module.

16. The system of claim 14 wherein the cell sensor module controller and the battery sensor module controller are configured to communicate processed data values from the cell sensor module to the battery sensor module.

17. The system of claim 14 wherein the battery sensor module controller is configured to process data communicated from any one of said plurality of cell sensor modules.

18. The system of claim 1 further comprising an alarm interface configured to communicate battery-related data between at least one battery sensor module and an external network.

19. A method of monitoring a battery comprising the steps of:

sensing one or more cell related physical parameters with a plurality of cell sensor modules;

recording the number of times one or more sensed cell values exceed one or more threshold values, wherein the one or more sensed cell values are associated with the one or more cell related physical parameters;

sensing one or more battery related physical parameters with a battery sensor module; and communicating data related to the step of cell sensing to the battery sensor module.

20. The method of claim 19 wherein the step of sensing cell related physical parameter comprises the step of:

sensing battery cell voltage.

21. The method of claim 19 wherein the step of sensing cell related physical parameters comprises the step of:

sensing battery cell temperature.

22. The method of claim 19 wherein the step of sensing battery related physical parameters comprises the step of:

sensing battery voltage.

23. The method claim 19 wherein the step C, of sensing battery related physical parameters comprises the step of:

sensing battery current.

24. The method of claim 19 wherein the step of sensing battery related physical parameters includes the step of:

sensing battery temperature.

25. The method of claim 19 wherein the step of recording comprises the step of:

recording the number of times the one or more sensed cell values exceed one or more threshold values with a controller within each cell sensor module.

26. The method of claim 19 further comprising the step of:

logging data related to the sensed cell values.

27. The method of claim 19 further comprising the step of:

recording the number of times one or more sensed battery values exceed one or more threshold values.

28. The method of claim 27 further comprising the step of:

processing and logging data related to the one or more sensed battery values.

29. The method of claim 28 further comprising the step of:

communicating sensed values from the cell sensor module to the battery sensor module.

30. The method of claim 28 further comprising the step of:

communicating processed data values from the cell sensor module to the battery sensor module.

31. The method of claim 28 further comprising the step of:

processing data from the plurality of cell sensor modules.

32. The method of claim 19 wherein the step of communicating comprises the step of:

communicating along an isolated-power network that includes a network interface at each cell sensor module, the interface respectively including local and remote power connections for the cell sensor and network sides of the interface.

33. The method of claim 32 wherein the step of communicating comprises the step of communicating along a daisy-chain serial link.

34. The method of claim 32 wherein the step of communicating comprises the step of communicating through opto-isolators configured to transmit data opto-electronically.

35. The method of claim 19 further comprising the step of:

communicating battery- or cell- related information between at least one battery sensor module and an external network through an alarm interface.

36. The battery monitor system of claim 1 wherein the sensor module is configured to monitor a high-voltage battery array.

* * * * *

UNITED STATES PATENT AND TRADEMARK OFFICE

CERTIFICATE OF CORRECTION

PATENT NO. : 6,677,759 B2
DATED : January 13, 2004
INVENTOR(S) : Friel et al.

It is certified that error appears in the above-identified patent and that said Letters Patent is hereby corrected as shown below:

Title page,
Item [73], Assignee, should read -- Microchip Technology Incorporated, Arizona --

Signed and Sealed this

Thirtieth Day of March, 2004

JON W. DUDAS
*Acting Director of the United States Patent and Trademark Office*